United States Patent [19]

Wu

[11] Patent Number: 4,525,221

[45] Date of Patent: Jun. 25, 1985

[54] ALLOYING OF ALUMINUM METALLIZATION

[75] Inventor: Chung P. Wu, Hamilton Township, Mercer County, N.J.

[73] Assignee: RCA Corporation, Princeton, N.J.

[21] Appl. No.: 610,838

[22] Filed: May 16, 1984

[51] Int. Cl.³ .............................................. H01L 21/24
[52] U.S. Cl. .................... 148/1.5; 29/576 B; 29/576 T; 148/187; 357/67; 357/91
[58] Field of Search ............... 148/1.5, 187; 29/576 B, 29/576 T; 357/67, 91

[56] References Cited

U.S. PATENT DOCUMENTS

| | | | |
|---|---|---|---|
| 3,885,993 | 5/1975 | Tihanyi | 148/1.5 |
| 4,017,890 | 4/1977 | Howard et al. | 357/67 |
| 4,331,485 | 5/1982 | Gat | 148/1.5 |
| 4,335,362 | 6/1982 | Salathe' et al. | 357/67 |
| 4,348,802 | 9/1982 | Shirato | 29/571 |
| 4,350,537 | 9/1982 | Young et al. | 148/1.5 |
| 4,359,486 | 11/1982 | Patalong et al. | 427/53.1 |
| 4,440,799 | 4/1984 | Fauth, Jr. | 427/8 |

OTHER PUBLICATIONS

Nowicki et al., Thin Solid Films, 67, (1980), 385.
Armigliato et al., In Laser & Electron Beam-. . . Processing (eds.), Gibbons et al., Elsevier, N.Y., 1981, p. 329.
Hung et al., Appl. Phys. Letts., 43, (Dec. 1983), 1123.
Hecht, L. C., J. Vac. Sci. Technol, 16, (1979), 328.
Japanese Journal of Applied Physics, vol. 22, No. 6, pp. 340-342, Jun. 1983-Hara et al.
Japanese Journal of Applied Physics, vol. 22, No. 11, pp. 683-685, Nov. 1983, Hara et al.
Towner et al., Applied Physics Letters, vol. 44, No. 2, pp. 198 and 199, Jan. 15, 1984.
AG Associates: Heatpulse Rapid Heating System Information Brochure.

*Primary Examiner*—Upendra Roy
*Attorney, Agent, or Firm*—B. E. Morris; R. H. Swope

[57] ABSTRACT

An improvement in the rapid alloying of aluminum metallization on a silicon substrate is provided. The structure is heated to alloying temperature for under a minute in a suitable heating means in a reducing atmosphere and rapidly cooled to under 200° C. in not longer than about one minute after cessation of heating. A preferred reducing atmosphere is forming gas.

8 Claims, 1 Drawing Figure

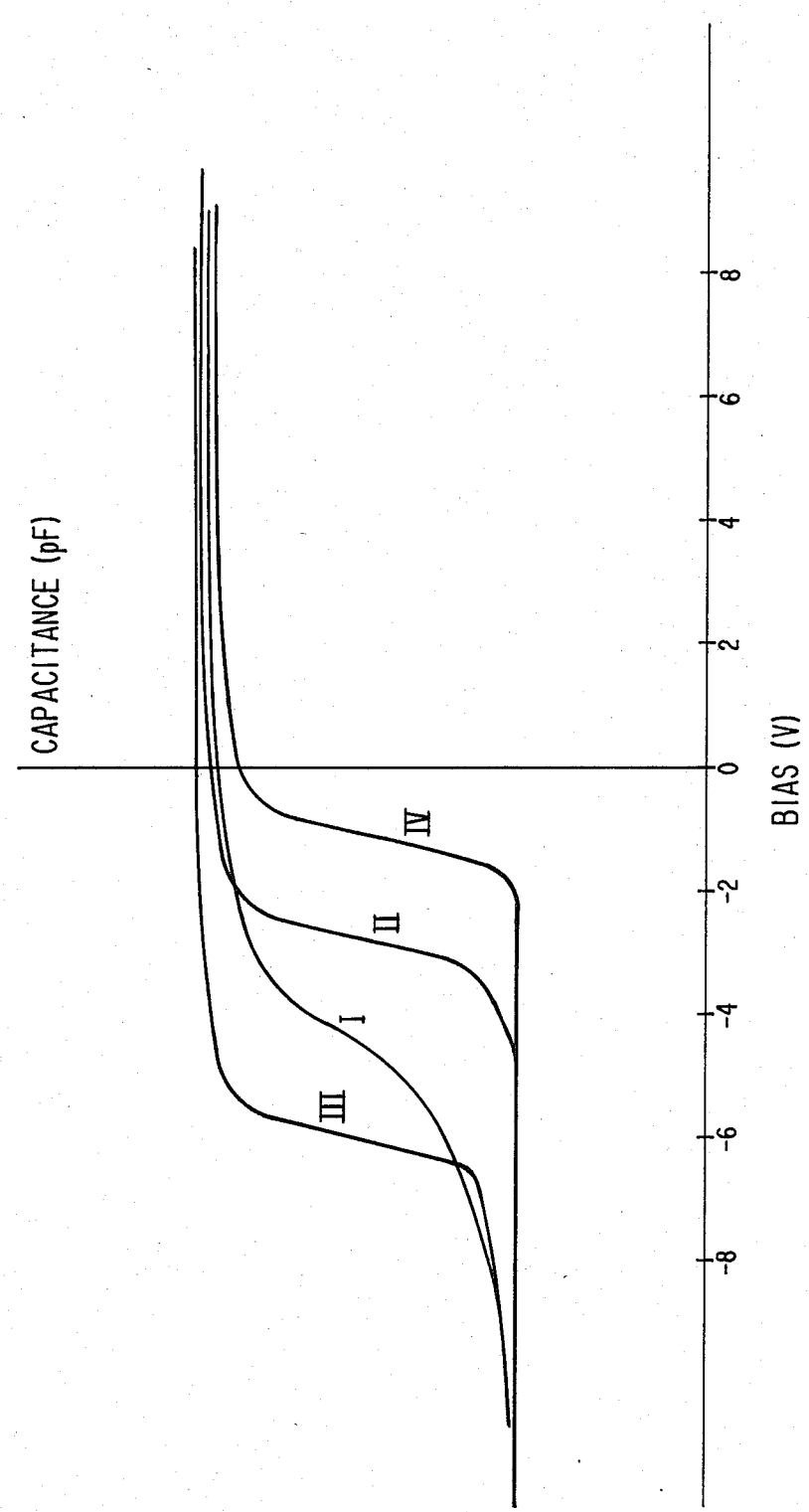

ALLOYING OF ALUMINUM METALLIZATION

This invention relates to a method of significantly improving the contact between a layer of aluminum or an aluminum alloy containing up to three percent by weight of silicon and an underlying silicon substrate.

BACKGROUND OF THE INVENTION

Metallization of silicon substrates with aluminum or alloys thereof, i.e. Al-Si or Al-Si-Cu, is commonplace in the manufacture of integrated circuits. The appearance of large hillocks in the surface of layers of aluminum metallization during metal deposition and/or patterning is relatively unusual. This is generally true for conventional deposition techniques, such as e-beam evaporation and magnetron sputtering.

It is conventional to heat silicon wafers after deposition of aluminum metallization to alloy the aluminum to the silicon substrate. Typically, the substrates are heated in a furnace to a temperature in excess of 400° C. for about thirty minutes. The alloying procedure substantially lowers the contact resistance between the aluminum metallization and the substrate and is necessary for the former to function, e.g., as interconnects in complex IC devices such as very-large-scale-integrated circuits, (VLSI).

Among the detrimental effects of conventional furnace alloying are loss of diode integrity and hillock formation. The former is a particular manifestation of the phenomenon known as "spiking". Spiking is caused by the silicon in the substrate being dissolved into the overlying aluminum film. This does not occur uniformly across the contact area, but at numerous discrete sites and results in downward projections of metal having, generally, the configuration of inverted pyramids. When one or more of these aluminum "spikes" reaches a subsurface active or passive device, such as a shallow p+n junction, the diode effect is lost. Spiking can result from either extended heating or heating to too high a temperature.

Hillocks are the result of the aluminum metallization being in compression during conventional alloying due to its high coefficient of thermal expansion, combined with being softened as a result of being heated to a temperature approaching its melting point of 660° C. This combination of stress and softening acts over residence time in the furnace to cause stress relief which is manifested as hillocks. The hillocks are typically about one micrometer in height and generally occur in densities of about $10^5/cm^2$. Hillocks create both circuit yield and reliability problems resulting from an undermining of overlying passivation or interlevel-dielectric layers.

The rapid alloying of aluminum metallization in only a few seconds with pulsed, high intensity visible light has been reported in the literature. This is an example of a heating means capable of supplying a pulse of energy to heat the substrate to alloying temperature within a few seconds. Another example of such heating means is graphite strip heating wherein a strip of graphite is heated to a high temperature, shielded and brought into close proximetry to the structure to be heated. The shield is removed for a few seconds, thus rapidly heating the substrate. Such rapid alloying is reported to improve contact resistance and virtually eliminate spiking. Although not reported in the literature, such rapid alloying also eliminates hillock formation resulting in consistently smooth surfaces. In accordance with this invention, a method has been found to utilize the rapid heating technology to produce a further, unexpected result.

SUMMARY OF THE INVENTION

Silicon wafers having a layer of aluminum metallization thereon are rapidly alloyed in less than one minute in a reducing atmosphere.

BRIEF DESCRIPTION OF THE DRAWING

The FIGURE is a compilation of C-V plots of determinations on chips demonstrating the improved results obtainable with the method of the subject invention.

DETAILED DESCRIPTION OF THE INVENTION

In accordance with this invention, it has been found that rapid alloying of aluminum metallization with a heating means capable of heating the structure to alloying temperature for less than one minute and cooling it to under 200° C. in not longer than about one minute, in a reducing atmosphere, unexpectedly, anneals radiation damage in the structure. Radiation damage, principally in the oxide layer which overlies the silicon substrate, can result from any processing step which involves ionization radiation such as, for example, depositing aluminum by electron beam evaporation, or plasma etching of a resist layer.

The effect of ionization on the oxide dielectric layer is two-fold. First, it causes the generation and trapping of positive charge in the oxide layer which produces a shift in high frequency C-V curves along the voltage axis toward the less desirable higher negative voltages. Second, it causes an increase in gross charge nonuniformities in the oxide layer and/or an increase in interface trap level density. Either of these effects causes the high frequency C-V curve to stretch out along the voltage axis. These effects are detrimental to the reliable operation of MOS devices and circuits.

The conventional method of annealing radiation damage in a structure containing aluminum metallization is to bake the structure at about 425° C. in a reducing gas atmosphere for about 30 minutes. It has been generally considered that, under these conditions, radiation damage annealing was a function of time and not temperature as it was necessary for the reducing gas, generally hydrogen, to diffuse into the substrate over a period of time in order for the desired effect to take place. Unexpectedly, it has been found that radiation damage can be annealed in a few seconds in accordance with the subject method, whereas the effect is not produced by annealing under the same conditions in dry nitrogen. The exact mechanism whereby this takes place is not known with certainty.

A structure comprising a silicon substrate having aluminum metallization thereon is alloyed in accordance with this invention suitably at temperatures of from about 490° to 540° C., preferably at about 500° to 525° C., in substantially less than one minute, suitably for from about 2 to 10 seconds, preferably from about 4 to 7 seconds, in a reducing gas atmosphere. A particularly preferred alloy procedure is heating the structure to about 520° C. for about 5 seconds in forming gas. These times and temperatures may vary somewhat depending on the particular heating means being utilized.

Alloying of aluminum metallization on silicon is carried out in a heating means for supplying a pulse of energy such that the substrate will be at alloying temperature for less than one minute. A preferred heating means is a pulsed, high intensity, visible light rapid heating system such as is commercially available under the trademark Heatpulse from A.G. Associates. This system utilizes incoherent light in contrast to, e.g., a laser which is a single frequency. The Heatpulse apparatus utilizes tungsten halogen high intensity lamps and a microprocessor-controlled system to regulate the heat pulses and the substrate temperature.

Another apparatus which can be utilized to alloy aluminum metallization in accordance with this invention is a graphite strip heater wherein the structure to be heated is briefly exposed to a strip of graphite which had been heated to a high temperature. Such apparatus is commercially available under the trademark Isothermal Annealer from Varian/Extrion. Such apparatus is also capable of providing a very rapid cool-down from the annealing temperature.

The temperatures required to alloy the subject structures in a suitable heating means such as a pulsed, high intensity visible light heating system, are typically somewhat higher than would be utilized in a conventional furnace. Because the substrate is heated to such temperatures for only a few seconds, however, the exposure thereto is not detrimental.

It also follows that the alloyed structure should be cooled rapidly to minimize reaction betwen aluminum and silicon. The temperature of the structure is suitably lowered to below 200° C. in not longer than about one minute after cessation of heating. Below 200° C., little or no reaction takes place. For example, in an alloy procedure carried out at 520° C., the temperature of the structure is suitably lowered to below 400° C. within 5 seconds of cessation of heating; to below 300° C. within 30 seconds; and to below 200° C. within one minute. In addition to minimizing aluminum/silicon reations, rapid cooling of the structure also aids in preventing hillock growth.

The silicon substrate in accordance with this invention, suitably single crystal silicon, typically contains buried within or on the surface various active and passive devices, such as transistors, diodes, resistors and the like. The substrate is typically covered with a dielectric layer of, e.g., silicon dioxide, through which various openings have been cut overlying the devices. The term "aluminum metallization" as used herein includes aluminum and alloys thereof with silicon or silicon and copper. Such alloys suitably contain up to about 3, preferably about 1, percent by weight of silicon. The aluminum metallization contacts the silicon substrate through the openings in the dielectric layer and is alloyed thereto in accordance with the subject process.

In accordance with this invention, the subject alloying process is carried out in a reducing atmosphere. A suitable reducing atmosphere is a hydrogen-containing gas such as hydrogen or a mixture thereof with an inert gas such as, for example nitrogen or argon. A preferred atmosphere is forming gas, i.e. a mixture nitrogen and hydrogen, conventionally in a 90/10 ratio by volume.

The subject process possesses significant advantages over the conventional technique of furnace alloying over, e.g., thirty minutes. The quality of the ohmic contacts formed by the subject process is at least as good as produced by conventional alloying. In addition, aluminum metallized silicon structures alloyed in accordance with the subject method are found to be substantially free of hillocks and to possess excellent diode integrity which indicates the substantial absence of aluminum spiking. Finally, annealing of radiation damage in such structures alloyed in accordance with the subject process is at least as good as, and generally superior to, that produced in conventional furnace annealing.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Two p-type (100) silicon wafers were coated with a steam grown layer of oxide 500 angstroms thick. A conventional 500 angstrom channel oxidation was followed by a double $+P^{31}$ implant ($2 \times 10^{15}$/cm$^2$ at 120 KeV, and $2 \times 10^{15}$/cm$^2$ at 60 KeV) to form three $600 \times 600$ micrometer n$^+$/p diodes in each chip after subdivision of the wafers. The implants were annealed at 950° in a nitrogen ambient for 60 minutes.

Contact cuts, about $3 \times 3$ micrometers, were photolithographically defined in the oxide overlying the channel or the implants, respectively. The wafers were dipped in dilute hydrofluoric acid for 60 seconds to remove any native oxide from the contact cuts and immediately placed in a vacuum deposition system. Aluminum containing 1 percent by weight of silicon was deposited onto the wafers to a thickness of 1.2 micrometers by conventional magnetron sputtering. The aluminum layer was photolithographically defined to form lines of metallization 25 micrometers wide overlying the contact cuts thereby forming Kelvin contacts as described in U.S. Pat. No. 4,440,779 issued Apr. 3, 1984. The wafers were scribed and each was cut into 12 chips. All chips for each test were from the same wafer so that pre-alloying conditions would be the same. Only chips with a pre-alloy contact resistance of 90 to 150 ohms were tested, as post-alloy contact resistance is strongly dependent on pre-alloy contact resistance.

Chips alloyed in a furnace were heated to 425° for 30 minutes in forming gas. This temperature was chosen because experience has shown it to provide the best contact resistance and diode integrity. The rapid alloyings were performed in forming gas in a Heatpulse annealer, Model 210-T, manufactured by A.G. Associates. By experimenting with temperatures over a wide range, 505° to 525° was selected as an optimum range. Six chips were run for each test and the test was repeated three times with chips from different wafers. It was determined that rapid alloying at these temperatures reduced contact resistance by a factor of about four and was at least equivalent to the 30 minute furnace alloy. Those chips alloyed in the furnace in accordance with the conventional technique were found to have a significant number of hillocks, whereas those alloyed in accordance with this invention had none.

It was further found that the diode integrity of the rapidly annealed chips was at least equivalent to conventional furnace processing in all chips. This would indicate that both groups of sample chips were essentially free of aluminum spiking.

EXAMPLE 2

In order to demonstrate the radiation annealing capability of the method of this invention, p-type (100) wafers were coated with 400 angstroms of thermally grown oxide. A layer of pure aluminum about 1 micrometer thick was deposited over the oxide. The aluminum was deposited by e-beam evaporation to simulate typical manufacturing procedures. Experience has shown that, although e-beam evaporation is advantageous for device manufacture, it will invariably produce radiation damage. The aluminum layer was photolithographically defined to form circles or dots approximately 20 mils in diameter. Utilizing probes to establish contact between the aluminum dots and the underlying wafer, conventional capacitance-voltage plots were taken for quarters of the same wafer. C-V Plots were determined for wafers that were: (I) not alloyed; (II) alloyed in a furnace at 425° for 30 minutes in forming gas; (III) rapid alloyed at 500° in the Heatpulse apparatus in dry nitrogen for 5 seconds; and (IV) rapid alloyed at 500° in forming gas for 5 seconds. The resulting C-V plots are shown in the FIGURE.

Referring to the FIGURE and using the plot for the nonalloyed wafer (I) as a point of reference, it can be observed that the rapid alloy in dry nitrogen (III) produced some annealing of radiation damage in the oxide layer. Specifically, the rapid dry nitrogen alloy appeared to reduce gross damage nonuniformities and/or interface trap level density in the oxide layer. This is evidenced by the fact that the dry nitrogen rapid alloy produced a sharper slope in the plot. However, in terms of overall effect, the dry nitrogen rapid alloy does not represent a significant improvement over the nonalloyed wafer.

The conventional furnace alloy (II) is clearly an improvement as the slope of the plot is steep and is closer to zero voltage. Likewise, the alloying method of this invention is clearly a significant improvement over all methods as it produces a steep plot close to zero voltage. This is significant because improvement becomes increasingly difficult to achieve as the plot approaches zero voltage. Therefore, the results plotted in the FIGURE clearly demonstrate the superiority of the method of this invention.

I claim:

1. In a method of heating a structure comprising a silicon substrate and a layer of aluminum metallization at least partially in contact therewith to a temperature sufficient to alloy said contact using heating means that will supply a pulse of energy such that the structure is heated to alloying temperature for less than one minute and cooled to below about 200° C. in not longer than about one minute after cessation of heating, the improvement comprising heating said structure in a reducing atmosphere.

2. The improved method in accordance with claim 1, wherein the heating means is a graphite strip heating means.

3. The improved method in accordance with claim 1, wherein the heating means is pulsed, high intensity, visible light heating means.

4. The improved method in accordance with claim 1, wherein the structure is heated to a temperature of from about 490° to 540° C. for from about 2 to 10 seconds.

5. The improved method in accordance with claim 4, wherein the reducing atmosphere is a hydrogen-containing gas.

6. The improved method in accordance with claim 5, wherein the reducing atmosphere is forming gas.

7. The improved method in accordance with claim 1, wherein the aluminum metallization is an alloy of aluminum and silicon containing up to about 3 percent by weight of silicon.

8. The improved method in accordance with claim 7, wherein the alloy contains about one percent by weight of silicon.

* * * * *